US009292652B2

(12) United States Patent
Aggarwal et al.

(10) Patent No.: US 9,292,652 B2
(45) Date of Patent: Mar. 22, 2016

(54) GENERIC DESIGN RULE CHECKING (DRC) TEST CASE EXTRACTION

(71) Applicant: INTERNATIONAL BUSINESS MACHINES CORPORATION, Armonk, NY (US)

(72) Inventors: Davinder Aggarwal, Punjab (IN); Vaibhav A. Ruparelia, Bangalore (IN); Neha Singh, Bangalore (IN); Janakiraman Viraraghavan, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 38 days.

(21) Appl. No.: 14/270,528

(22) Filed: May 6, 2014

(65) Prior Publication Data

US 2015/0324510 A1 Nov. 12, 2015

(51) Int. Cl.
*G06F 9/455* (2006.01)
*G06F 17/50* (2006.01)

(52) U.S. Cl.
CPC .................................. *G06F 17/5081* (2013.01)

(58) Field of Classification Search
USPC .......................................................... 716/112
See application file for complete search history.

(56) References Cited

U.S. PATENT DOCUMENTS

| | | | | |
|---|---|---|---|---|
| 5,724,504 | A | 3/1998 | Aharon et al. | |
| 5,774,358 | A | 6/1998 | Shrote | |
| 6,063,132 | A | 5/2000 | DeCamp et al. | |
| 6,212,667 | B1 | 4/2001 | Geer et al. | |
| 6,526,546 | B1 | 2/2003 | Rolland et al. | |
| 6,606,735 | B1 | 8/2003 | Richardson et al. | |
| 6,611,946 | B1 | 8/2003 | Richardson et al. | |
| 6,732,338 | B2 | 5/2004 | Crouse et al. | |
| 7,254,791 | B1 | 8/2007 | Agrawal et al. | |
| 7,430,729 | B2 | 9/2008 | McLain et al. | |
| 7,757,190 | B2 | 7/2010 | Dai et al. | |
| 2006/0218516 | A1 | 9/2006 | McLain et al. | |
| 2007/0038970 | A1 | 2/2007 | DeMaris et al. | |
| 2007/0156379 | A1 * | 7/2007 | Kulkarni et al. | 703/14 |
| 2009/0187867 | A1 | 7/2009 | Lawrence | |
| 2012/0047479 | A1 * | 2/2012 | Paris et al. | 716/112 |
| 2015/0204799 | A1 * | 7/2015 | Cipriany et al. | 702/185 |

OTHER PUBLICATIONS

U.S. Appl. No. 13/833,028, filed Mar. 15, 2013, 21 pages.
"Design Rule Checking", Wikipedia; http://en.wikipedia.org/wiki/Design_rule_checking; last modified on Mar. 7, 2013, and previously modified on Nov. 17, 2012; 3 Pages.
Gangadharan et al., "An Error Comparision Scheme for Design Rule Checking Flow"., VDAT 2007, Kalkota, India, 23 pages.

* cited by examiner

*Primary Examiner* — Paul Dinh
*Assistant Examiner* — Bryce Aisaka
(74) *Attorney, Agent, or Firm* — Steve Meyers; Andrew M. Calderon; Roberts Mlotkowski Safran & Cole, P.C.

(57) ABSTRACT

A computer-aided testing is provided for design verification of integrated circuits. More specifically, a method of generating a test case in design rule checking is provided for that includes extracting coordinates of an error marker for a first error identified in an integrated circuit design. The method further includes identifying a first rectangle that encloses the error marker. The method further includes generating a first test case based on data of the integrated circuit design contained within the rectangle. The method further includes determining whether the first test case is representative of the first error. The method further includes in response to determining the first test case is not representative of the first error, identifying a second rectangle that is between the first rectangle and a third rectangle. The method further includes generating a second test case based on data of the integrated circuit design contained within the second rectangle.

19 Claims, 10 Drawing Sheets

DRC_Rule1: L1 width over L2 for 45° NFET device Leff >= [value] ← 505

Layers involved in DRC_Rule1: L1, L2, L3, L4, L5, L6 ← 510

9839840 14314580
9840100 14314120
9840860 14314880
9840400 14315140
← 515

520

| DRC Code | Comment |
|---|---|
| INCLUDE $TECHDIR/DRC/Include/*.layers.cal | Layer definition extracted from original DRC runset |
| LAYER TEMP_ERROR 5953 | Temporary error layer |
| POLYGON 9839.840000 14314.580000 9840.100000 14314.120000 9840.860000 14314.880000 9840.400000 14315.140000 TEMP_ERROR | Temporary error polynomial |
| TEST DRC_Rule1 { @ Generating test case for DRC_Rule1 COPY (EXTENT ((L1 OR (L2 OR (L3 OR (L4 OR (L5 OR L6))))) INTERACT TEMP_ERROR))} | INTERACT: selects polygons that touch the error polynomial EXTENT: smallest rectangle encloses polygons touching error polynomial |

GENERIC DESIGN RULE CHECKING (DRC) TEST CASE EXTRACTION

FIELD OF THE INVENTION

The invention relates to testing of integrated circuits and, more particularly, to computer-aided testing for design verification of integrated circuits.

BACKGROUND

Design rule checking (DRC) is used in electronic design automation (EDA) of integrated circuits to determine whether the physical layout of a particular chip design satisfies a series of recommended parameters called design rules. Design rules are a series of parameters provided by semiconductor manufacturers that enable the designer to verify the correctness of a mask set. Design rules are specific to a particular semiconductor manufacturing process. A design rule set specifies certain geometric and connectivity restrictions to ensure sufficient margins to account for variability in semiconductor manufacturing processes, so as to ensure that most of the parts work correctly.

Specific design rule checks verify the shape and sizes of various circuit components that are diffused, deposited, or etched onto a chip. Additionally, design rule checking also verifies that the shapes are of the proper size, shape, and type, and furthermore, that the shapes are not placed so close together within the chip that they will not work. Design rule checking may involve a general purpose shapes processing program (GPSPP) that receives inputs from two files: runset and physical layout files. The runset file is a command language input file that instructs the processor executing the GPSPP how to perform the design rule checks. The runset may include several hundred individual design rule checks, for example. The runset may also be referred to as a DRC runset, a rule deck, or merely a deck.

Design rules (also referred to as DRC rules) specify how the layers in the layout should be arranged to ensure good manufacturing yield in a foundry. The runset is provided by the foundry and is coded based on a design manual. Inputs from the technology development and manufacturing teams, and information on the devices supported in a particular technology, are used by the design manual team to create the DRC rules in the design manual. It is thus advantageous to ensure that the runset is consistent with the design manual since customers are expected to ensure their designs are "DRC clean" on a "golden" runset.

When developing a runset for a semiconductor process, a set of layout test cases is used to verify functionality and accuracy. The task of creating test cases for runsets exists across all organizations and companies that are code checking runsets. The code for DRC is created based on a set of layout design rules or parameters for a particular semiconductor process. The code and test cases are both manually created.

A runset may be validated with regression testing that uses shape-based test cases that are based on rules described in the design manual. For example, regression testing involves creating such test cases and verifying the test cases against the runset. The test cases used in regression testing are not based on an actual circuit design, but rather are simple shapes based on rules included in the design manual and designed to trigger either a pass condition or a fail condition when verified against the runset. Both pass test cases and fail test cases are built to ensure good verification coverage of the design rules. For example, the fail test cases are designed to cause the runset to report an error, and the pass test cases are designed such that the runset should not report an error. In the event the runset does not behave as expected according to the test cases, then one or more design rule checks in the runset may be modified, or the design manual itself may be modified, or both.

Since the test cases used in regression testing are manually created, they are necessarily limited by the imagination and/or expertise of the person tasked with creating the test cases. This person-based limitation can limit the verification coverage provided by the test cases. The verification coverage is also limited since the number of ways in which a rule can be violated grows exponentially with the number of layers/constraints involved in the rule. As the number of layers and constraints in a design increases, it becomes unworkable to manually create test cases that provide sufficient verification coverage.

SUMMARY

In a first aspect of the invention, there is a method of generating a test case in design rule checking that includes extracting coordinates of an error marker for a first error identified in an integrated circuit design. The method further includes identifying a first rectangle that encloses the error marker. The method further includes generating a first test case based on data of the integrated circuit design contained within the rectangle. The method further includes determining whether the first test case is representative of the first error. The method further includes in response to determining the first test case is not representative of the first error, identifying a second rectangle that is between the first rectangle and a third rectangle. The method further includes generating a second test case based on data of the integrated circuit design contained within the second rectangle In another aspect of the invention, there is a system having a computer device including a processor and a design tool that is structured and configured to perform design rule checking of an integrated circuit design. The design tool is further structured and configured to identify a first violation of a design rule during the design rule checking. The design tool is further structured and configured to extract coordinates of an error marker associated with the violation. The design tool is further structured and configured to identify a first rectangle that encloses the error marker. The design tool is further structured and configured to generate a first test case based on data of the integrated circuit design contained within the first rectangle. The design tool is further structured and configured to determine whether the first test case is representative of the first violation. The design tool is further structured and configured to in response to determining the first test case is not representative of the first violation, identify a second rectangle that is half way between the first rectangle and a third rectangle. The design tool is further structured and configured to generate a second test case based on data of the integrated circuit design contained within the second rectangle.

In another aspect of the invention, there is a computer program product for generating a test case. The computer program product includes a computer readable storage medium having program code embodied therewith, the program code being readable and/or executable by a processor of a computer device to perform a method comprising extracting coordinates of an error marker for a first error identified in an integrated circuit design. The method further includes identifying a first rectangle that encloses the error marker. The method further includes generating a first test case based on data of the integrated circuit design contained within the rectangle. The method further includes running a design rule check on the first test case to identify a second error. The method further includes importing a reference error marker for the second error. The method further includes comparing the reference error marker for the second error to the error marker for the first error. The method further includes in response to the reference error marker for the second error not matching the error marker for the first error, identifying a second rectangle that is between the first rectangle and a third rectangle. The method further includes generating a second test case based on data of the integrated circuit design contained within the second rectangle.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 5 shows exemplary programming for performing aspects of the invention;

DETAILED DESCRIPTION

Figure 1:
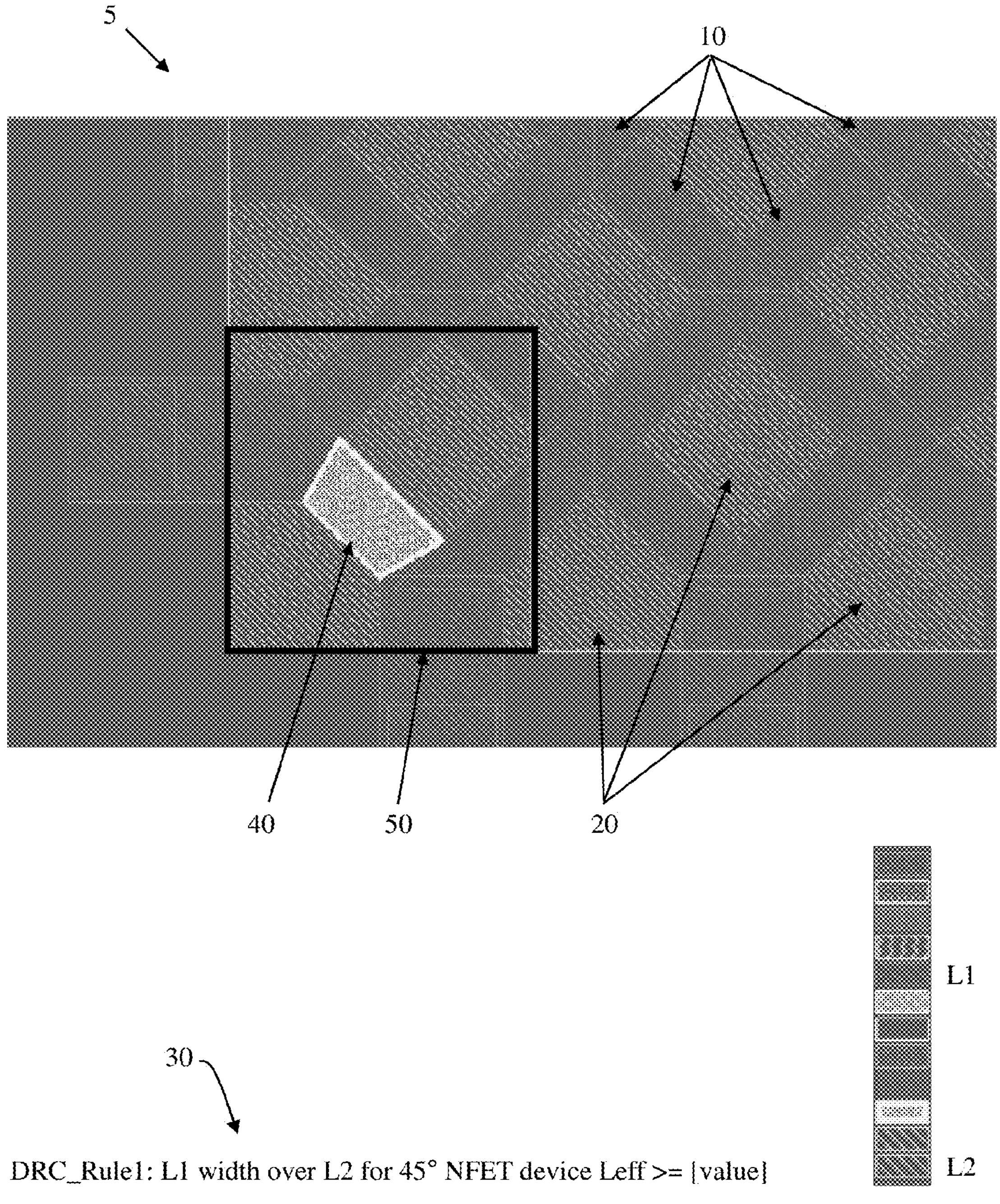
FIG. 1 depicts a portion of an integrated circuit design in accordance with aspects of the invention.

The invention relates to testing of integrated circuits and, more particularly, to computer-aided testing for design verification of integrated circuits. According to aspects of the invention, a test case for verifying a DRC runset is automatically generated based on an error that is identified when performing design rule checking of an existing integrated circuit design. In embodiments, the error is identified by performing design rule checking of the integrated circuit design using two different design tools that use two different runsets, and identifying discrepancies between results of the two different design tools. In implementations, the test case is automatically generated by, for example: extracting coordinates of an error marker associated with the error; creating a polygon that is the union of all shapes in the integrated circuit design that touch the error marker; determining the coordinates of a smallest rectangle that encloses the polygon; and generating a unit level test case based on the coordinates of a smallest rectangle.

In this manner, test cases for verifying DRC runsets may be automatically generated based on actual integrated circuit designs. Moreover, by including only the shapes that touch the error region, the automatically generated test cases in accordance with aspects of the invention contain sufficient information for debugging the runset, but are not so large as to impose great computational penalties during the runset debugging.

Test cases generated in aspects of the invention may be used to verify the runset of a design tool, in addition to regression testing. Test cases generated in aspects of the invention improve test coverage of the runset, compared to regression testing alone, by looking at failures that occur in an existing integrated circuit design, e.g., at the highest level in a hierarchy of a larger integrated circuit design.

Testing of an existing integrated circuit design (referred to as "IP testing") addresses the issue of testing the runset on complicated yet practical test cases. In IP testing, the runset is verified on an existing integrated circuit design that is typically very large. The existing design may include a customer's design of an integrated circuit, for example, which means that test cases generated from IP testing have a practical basis and thus are well-suited for verifying a DRC runset. Any errors reported on existing integrated circuit designs are necessarily true errors, which should not be missed. False errors and missed errors are detected in aspects of the invention by performing DRC testing of the existing design using two different tools having two different runsets, and noting any discrepancy of when one of the tools indicates an error that the other tool does not. Such a discrepancy can be due to either a false error (i.e., the design does not have an error, meaning that the tool reporting the error has a bug) or a missed error (i.e., the design does have an error, meaning that the tool not reporting the error has a bug). A true error is where both design tools agree in indicating an error in the design, in which case there is not a discrepancy between the design tools and no test case is generated for such an error.

It is noted that a discrepancy is not always due to a bug in one of the runsets that results in a change being made to one of the runsets. For example, discovering such a discrepancy may result in changing design manual wording or reporting a tool limitation to the DRC tool vendor. Specifically, although the design manual specifies a particular intent of a DRC rule, the DRC rule when written and implemented may not capture and/or convey the intent. In such cases, finding of a discrepancy during IP testing may result in changing the wording of the design manual rather than changing the DRC code.

IP testing may be performed on large existing designs to the extent that the design is even able to be loaded in a DRC tool. Due to the large size of existing designs, viewing a DRC error in the DRC tool can be difficult. It is therefore desirable to extract relatively small test cases from the larger design, which test cases are representative of the actual error found in the design. To this end, a representative test case should: be much smaller than the whole existing design; reproduce the error seen in the existing design; and clearly show the structure that resides in the design. Showing the structure that resides in the design is useful since a design manual change may result from the discrepancy, in which case it is useful to be aware of the exact structure in the design to determine whether it is consistent with the intent of the design manual.

FIG. 1 shows an example of an error in an existing integrated circuit design 5 in IP testing in accordance with aspects of the invention. The exemplary design includes shapes 10 (e.g., features, objects, etc.) formed in a first layer "L1" and shapes 20 (e.g., features, objects, etc.) formed in a second layer "L2" of the integrated circuit. An exemplary DRC rule 30 is also shown in FIG. 1. The exemplary rule 30 specifies a width of L1 over L2 at 45°. An error marker 40 shows a location of an error, i.e., a violation of the rule 30.

The display of FIG. 1 may be generated and displayed using a DRC tool, e.g., by loading a runset including at least DRC rule 30 into the tool, loading a design including at least L1 and L2 into the tool, and verifying the design against the runset using the tool. The DRC tool may be implemented, for example, using special purpose programming that is loaded in and executed on a computer device, e.g., as described with respect to FIG. 6 herein. The DRC tool may be a standalone program or included as a module of another program such as a process design kit (PDK), e.g., as described with respect to FIG. 7 herein.

Still referring to FIG. 1, one approach to generating a test case based on the error marker 40 is to draw a rectangle 50 around the error marker 40, and create a test case data structure (e.g., a file) that includes a portion of the design data included within the bounds of the rectangle 50. The format of the data can be any suitable format, such as graphic data system (GDS), GDSII, etc. Manually drawing the rectangle 50 involves some action (e.g., input) by a user of the DRC tool, and thus does not represent a fully automated approach for generating the test case. Moreover, arbitrarily selecting a size of the rectangle 50 does not necessarily include sufficient structure of the design 5 to permit an engineer or designer to determine whether the design as a whole complies with the intent of the design manual, e.g., when debugging the runset using the generated test case.

Figure 2:
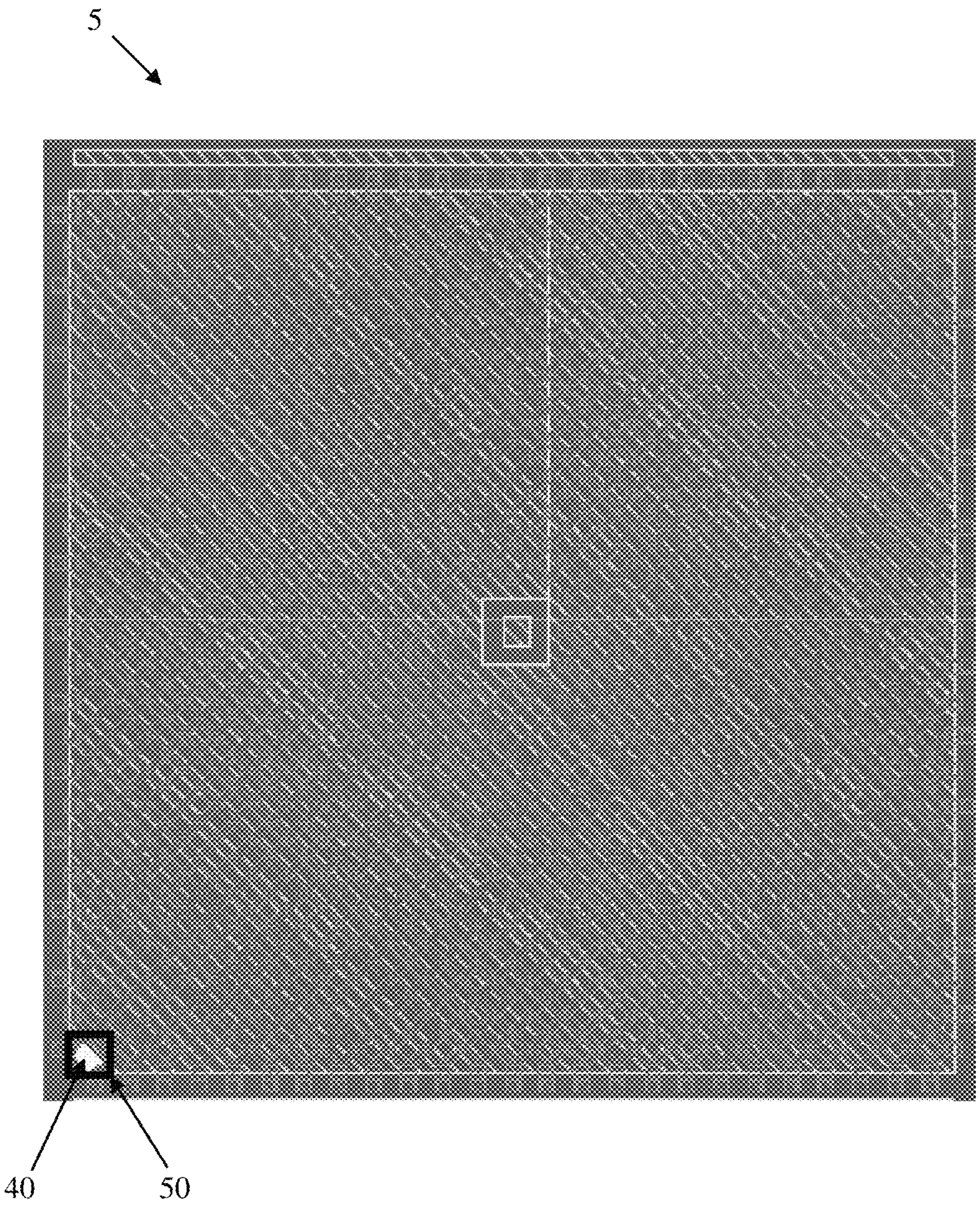
FIG. 2 depicts a portion of an integrated circuit design in accordance with aspects of the invention.

FIG. 2 shows a larger portion of the design 5 of FIG. 1. As depicted in FIG. 2, the design 5 includes an allowable valid structure that is not discernable when only viewing the rectangle 50 surrounding error marker 40. An exemplary solution to this problem is to ask the designer to add a waiver layer to prevent this error from being flagged on the structure, in which case no change in the DRC deck is required.

Figure 3A:
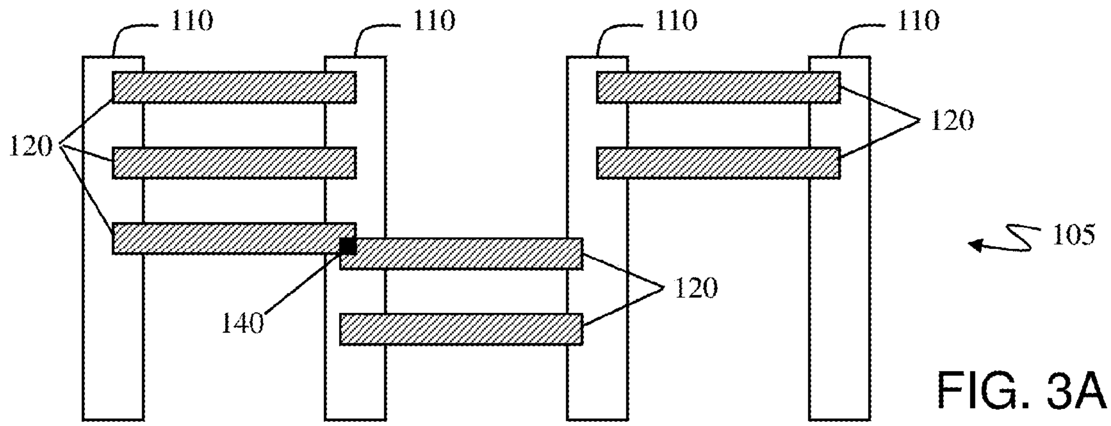
FIGS. 3A-3C depict steps of generating an area for extracting test case data in accordance with aspects of the invention.
Figure 3B:
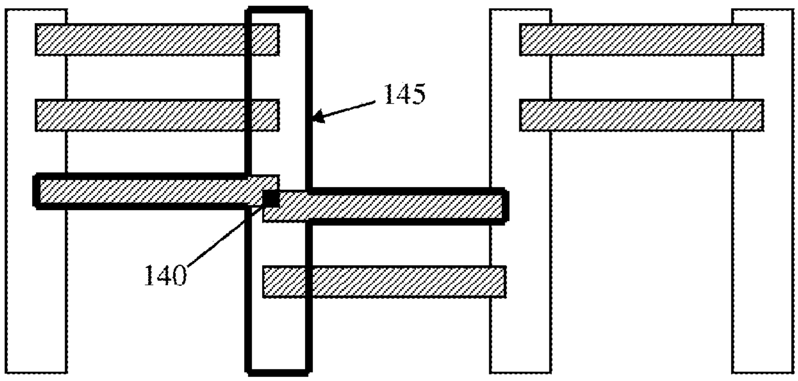
Figure 3C:
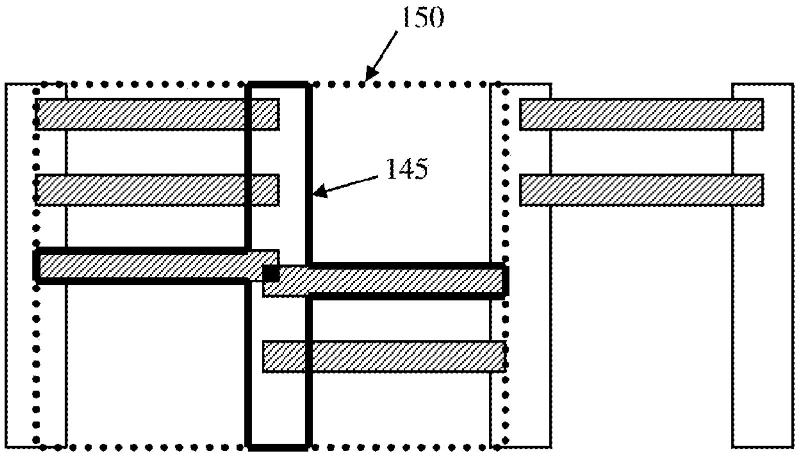

FIGS. 3A-3C depict steps of generating an area for extracting test case data in accordance with aspects of the invention. In particular, FIG. 3A shows an exemplary portion of another design 105 including shapes 110 in a first layer and shapes 120 in a second layer. Error marker 140 represents the location of an error where the design 105 violates a DRC rule contained in a runset.

With reference to FIGS. 3B and 3C, and according to aspects of the invention, a test case is created by: identifying all the shapes that touch the error marker 140; creating a polygon 145 that is a union of all the shapes touching the error marker 140 (FIG. 3B); creating the smallest rectangle 150 that encloses the polygon 145 (FIG. 3C); and creating a test case data structure (e.g., a file) by extracting and saving data of the design 105 (e.g., GDS data) that is included in the rectangle 150. In embodiments, the smallest rectangle 150 is the rectangle that is coincident with outermost edges of the polygon 145. By using the smallest rectangle, implementations of the invention generate a test case that is relatively small so as not to be too computationally expensive during debugging, but which test case still contains enough design information (e.g., the shapes contained in the rectangle) to provide the debugger with context of the design surround the error.

In embodiments, identifying the shapes, creating the polygon, creating the smallest rectangle 150, and creating the test case data structure are all performed automatically. For example, a script (e.g., routine, program, etc.) may be written that uses commands of the DRC tool to perform these steps in this order, thereby resulting in the automatic generation of a test case associated with the error. For example, the script (e.g., routine, program, etc.) may utilize commands such as: "interact" to select shapes (e.g., polygons) that touch the error marker 140; "extent" to create the smallest rectangle 150; and "yank" or "layout copy" to extract GDS data of the design that is included in the rectangle 150.

Figure 4:
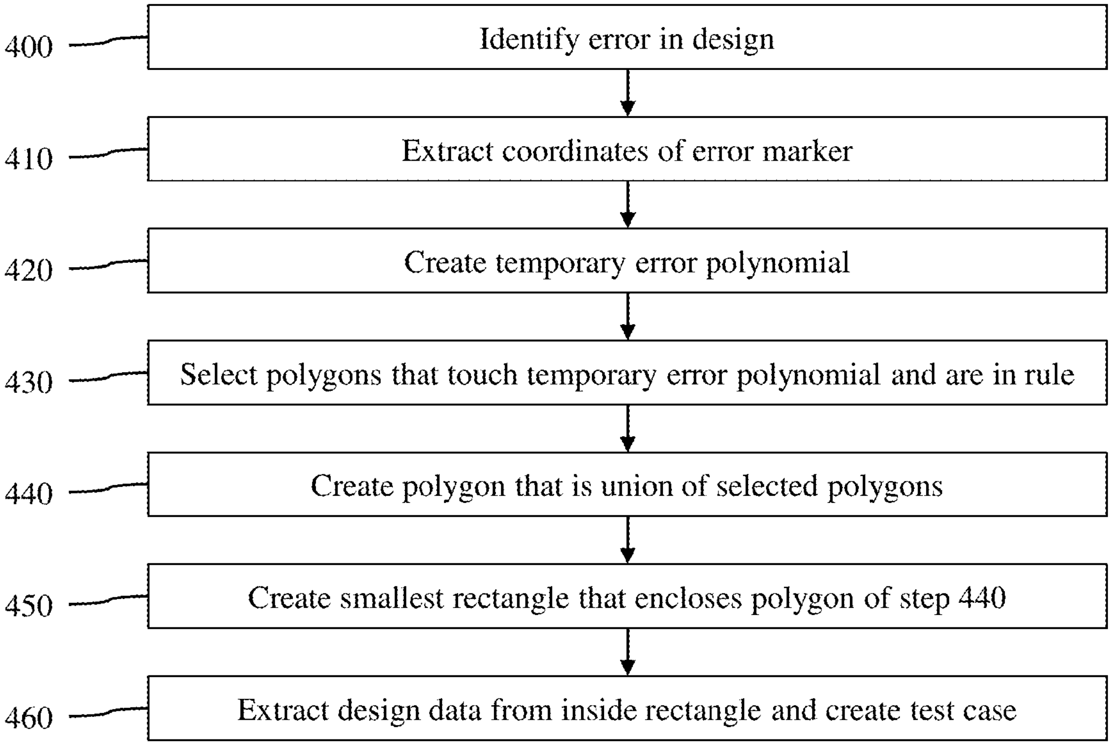
FIG. 4 shows a flowchart of a process in accordance with aspects of the invention.

FIG. 4 shows an exemplary flowchart and/or block diagram for performing aspects of the present invention. The steps of FIG. 4 may be implemented, for example, in the environment of FIG. 6, which is described in greater detail herein. As noted below, the flowchart illustrates the architecture, functionality, and operation of possible implementations of systems, methods, and computer program products according to various embodiments of the present invention. More specifically, FIG. 4 depicts an exemplary flowchart for a process in accordance with aspects of the present invention. The steps of FIG. 4 may be performed by a computer-based design tool using commands that are included in (e.g., programmed in) the design tool. The computer-based design tool may be implemented in the environment of FIG. 6, for example, and may comprise a combination of hardware and special-purpose software that is configured to perform the functions described herein.

At step 400, the design tool identifies an error (e.g., a design rule violation) in a design of an integrated circuit by applying at least one DRC rule included in a runset against the integrated circuit design. The error represents a situation where the design violates the DRC rule. Step 400 may include loading layout data (e.g., GDS data) of the design into the design tool. Step 400 may also include loading two different runsets into the design tool. In embodiments, step 400 may further include verifying the design using the two different runsets and identifying any false errors or missed errors. In this case, the error identified at step 400 is an error that is reported by only one of the two runsets, which indicates a discrepancy between the runsets. Alternatively, the error identified at step 400 may be determined by verifying the design using a single runset, in which case it is not determined whether the error is a false error, a missed error, or a true error.

At step 410, the design tool extracts the coordinates of an error marker for the error identified at step 400. At step 420, the design tool creates a temporary polygon layer with the error coordinates from step 410. The temporary polygon layer may be referred to as the temporary error polygon (or error shape). At step 430, the design tool identifies (e.g., selects) a set of polygons in the design that touches the error polygon and are included in a list of layers associated with the DRC rule that is the basis of the error from step 400. At optional step 440, the design tool creates a polygon which is the union of the set of polygons identified at step 430. At step 450, the design tool identifies a smallest rectangle that encloses the polygon created at step 440 or, when step 440 is omitted, the smallest rectangle that contains all of the polygons touching the temporary error polygon as identified at step 430. At step 460, the design tool extracts data from the design data that is included within the rectangle identified at step 450 and saves the data in a test case data structure.

FIG. 5 shows an exemplary DRC rule 505 which may represent, for example, the DRC rule that generated the error at step 400 of FIG. 4. In embodiments, the DRC rule 505 is associated with a list of layers 510 of the integrated circuit design. FIG. 5 also depicts exemplary coordinates 515 of the error marker determined at step 410. FIG. 5 further depicts program code for implementing function described with respect to the flowchart of FIG. 4. For example, code portions 520 may be employed to implement the functionality of step 420, and code portion 525 may be employed to implement the functionality of steps 430, 440, and 450. Although not shown, a command such as "yank", "layout copy", or the like may be employed to implement the functionality of step 460. The code portions 520 are implemented in CALIBRE®, which is a trademark of Mentor Graphics Corporation of Wilsonville, Oreg. Aspects of the invention may be implemented using any suitable computer design software for electronic design automation, and are not limited to the particular software shown in FIG. 5.

Figure 6:
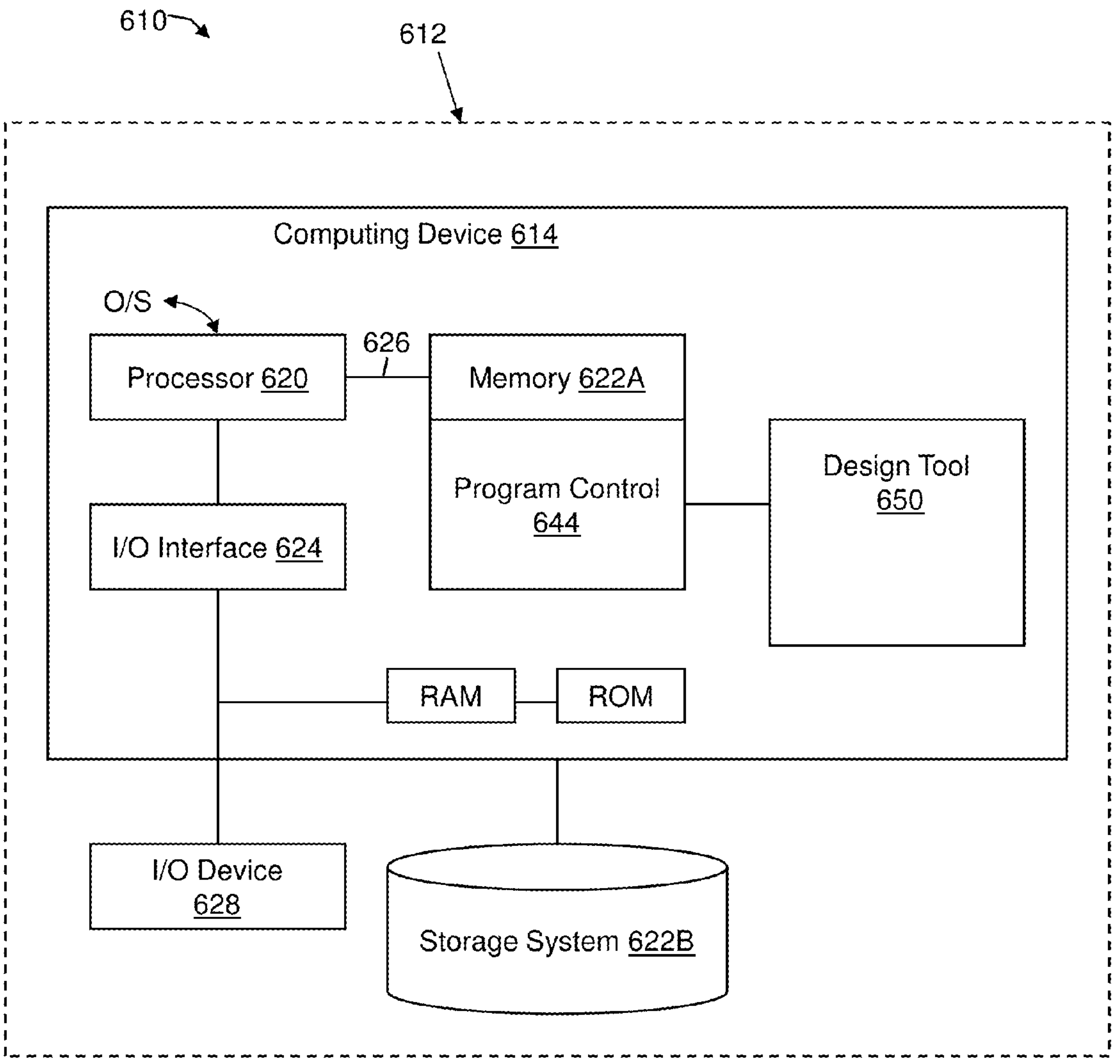
FIG. 6 shows an illustrative environment for performing the processes in accordance with the invention.

FIG. 6 shows an illustrative environment 610 for managing the processes in accordance with the invention. As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product that includes a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Still referring to FIG. 6, the environment 610 includes a server or other computing system 612 that can perform the processes described herein. In particular, the system 612 includes a computing device 614. The computing device 614 can be resident on a network infrastructure or computing device of a third party service provider (any of which is generally represented in FIG. 6).

The computing device 614 also includes a processor 620, memory 622A, an I/O interface 624, and a bus 626. The memory 622A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 614 is in communication with the external I/O device/resource 628 and the storage system 622B. For example, the I/O device 628 can comprise any device that enables an individual to interact with the computing device 614 (e.g., user interface) or any device that enables the computing device 614 to communicate with one or more other computing devices using any type of communications link. The external I/O device/resource 628 may be for example, a handheld device, PDA, handset, keyboard etc.

In general, the processor 620 executes computer program code (e.g., program control 644), which can be stored in the memory 622A and/or storage system 622B. Moreover, in accordance with aspects of the invention, the program control 644 controls a design tool 650, e.g., that performs one or more of the processes described herein. The design tool 650 can be implemented as one or more program code in the program control 44 stored in memory 622A as separate or combined modules. Additionally, the design tool 650 may be implemented as separate dedicated processors or a single or several processors to provide the function of these tools. While executing the computer program code, the processor 620 can read and/or write data to/from memory 622A, storage system 622B, and/or I/O interface 624. The program code executes the processes of the invention. The bus 626 provides a communications link between each of the components in the computing device 614.

The computing device 614 can comprise any general purpose computing article of manufacture capable of executing computer program code installed thereon (e.g., a personal computer, server, etc.). However, it is understood that the computing device 614 is only representative of various possible equivalent-computing devices that may perform the processes described herein. To this extent, in embodiments, the functionality provided by the computing device 614 can be implemented by a computing article of manufacture that includes any combination of general and/or specific purpose hardware and/or computer program code. In each embodiment, the program code and hardware can be created using standard programming and engineering techniques, respectively.

Similarly, the system 612 is only illustrative of various types of computer infrastructures for implementing the invention. For example, in embodiments, the system 612 comprises two or more computing devices (e.g., a server cluster) that communicate over any type of communications link, such as a network, a shared memory, or the like, to perform the process described herein. Further, while performing the processes described herein, one or more computing devices on the system 612 can communicate with one or more other computing devices external to the system 612 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 7:
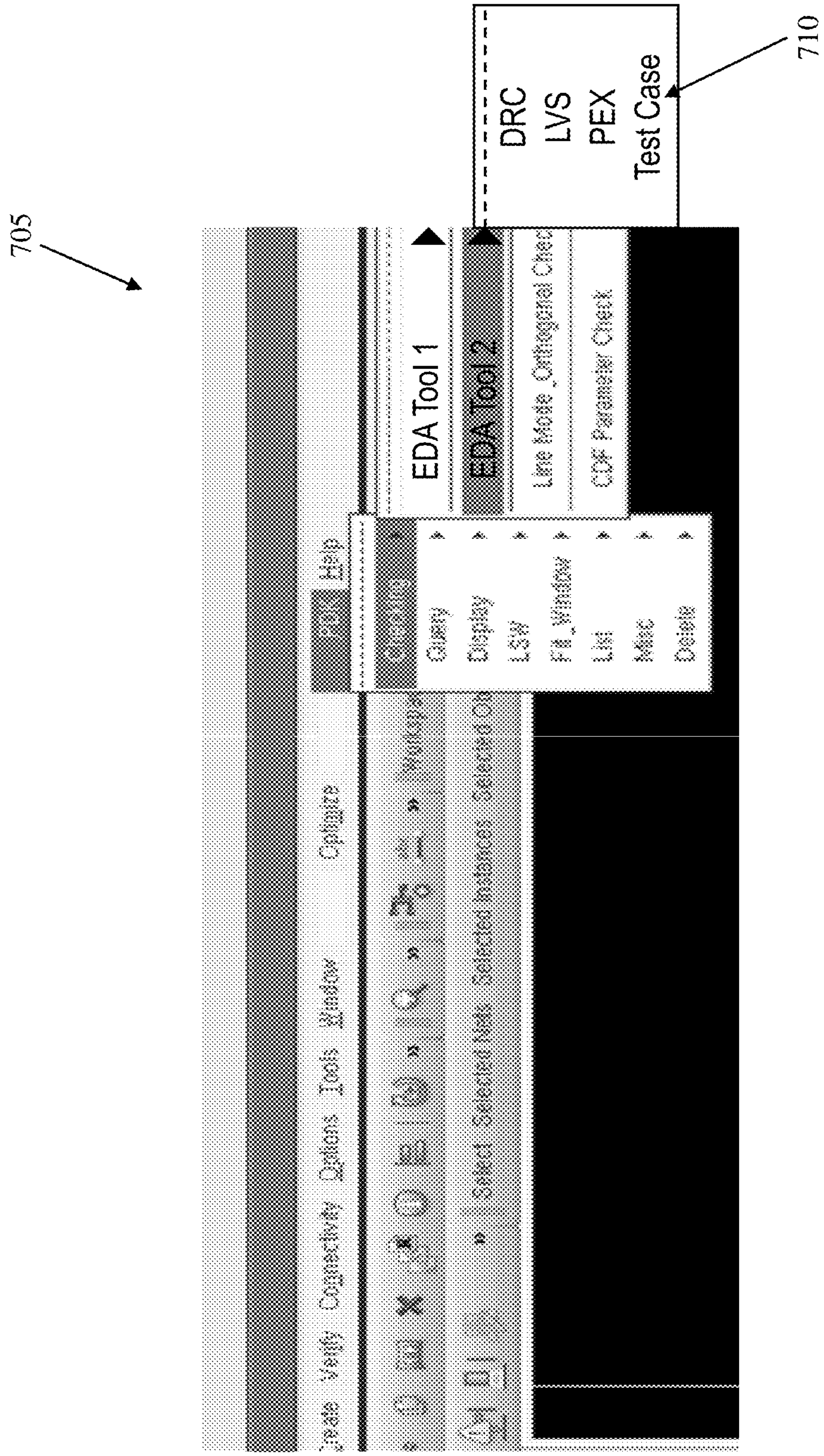
FIG. 7 shows an exemplary interface providing functionality in accordance with aspects of the invention.

FIG. 7 shows an exemplary computer-based graphical user interface 705 in accordance with aspects of the invention. As depicted in FIG. 7, design tool software included in a process design kit (PDK) may be programmed to include a "Test Case" menu option 710 that generates a test case in a manner described herein, e.g., as described with respect to FIGS. 3A-C, 4, and 5. In this manner, a customer may generate a test case and include the test case as part of debug information submitted to a foundry. Since the test case according to aspects of the invention does not include the entire integrated circuit design, the customer is able to avoid submitting the entire design to the foundry. This is advantageous for customers who are prohibited from sharing the entire design with a third party.

As described herein, implementations of the invention may be used to save significant amounts of time by generating test cases at the time of IP testing. Moreover, aspects of the methods described herein are technology independent and can be implemented using commands of commercial DRC tools. Test cases according to aspects of the invention may also be automatically generated at regression testing time and used to improve the debugging during regression testing. Furthermore, application engineers may use aspects of the invention to report DRC discrepancies and to reduce the size of test cases included for debug purposes, e.g., from 36 Mb to 16 Kb in one example, and from 236 Mb to 246 Kb in another example.

As described herein, and according to aspects of the invention, when a discrepancy is seen between two DRC tools, the one flagging the error will display an error marker, e.g., a polygon, showing the region where the DRC rule is failing. Implementations of the invention identify a minimal region around the error marker which will reproduce the error. Arbitrarily choosing a large rectangular region around the error marker might reproduce the error but the test case might be too large, e.g., too computationally expensive. Conversely, a small rectangular region may not even reproduce the discrepancy. Implementations of the invention identify the smallest region around the error marker which reproduces the discrepancy by using the error marker as the reference. All shapes in the design involved in that error (e.g., that interact, touch, overlap, etc., the error marker) are used to generate a polygonal region which is involved in flagging this error. The coordinates of a smallest rectangle enclosing this polygon are then extracted, which is in turn used to generate the unit level test case. The unit level test cases, owing to their small sizes, are relatively simpler than entire designs in analyzing and resolving the discrepancy. Additionally, these unit level test cases can be added to regression test libraries for future DRC deck validation.

The test cases generated in accordance with above-described aspects of the invention may be used for a majority of DRC rules in a design manual, e.g., most spacing based rules. However, a minority of DRC rules may be more complex than those described with respect to FIGS. 3A-C, 4, and 5, and therefore, may require additional processes to those described above to generate appropriate test cases. For example, complex DRC rules that require sizing of objects to touch the error marker, connectivity information, and/or sizing of compound derived layers may have need of additional processes to identify and generate the test cases for extraction.

Accordingly, additional aspects of the invention include refining the smallest rectangle generated using the processes described above with respect to FIGS. 3A-C, 4, and 5 to encompass additional data from the design data that may be necessary for more complex DRC rule analysis. The additional data captured using the refined smallest rectangle may then be incorporated into a refined test case for analyzing errors identified using the more complex DRC rules. In embodiments, the errors are identified similarly by performing design rule checking of the integrated circuit design using two different design tools that use two different runsets that include more complex rules, and identifying discrepancies between results of the two different design tools. In implementations, the refined test case is automatically generated by, for example: determining the coordinates of the smallest rectangle (e.g., a simple test case boundary) that encloses the polygons touching the error marker in accordance with the processes described with respect to FIGS. 3A-C, 4, and 5; determining the coordinates of a largest rectangle in accordance with dimensions of the chip edge; determining coordinates of a new rectangle in accordance with the coordinates of the smallest rectangle and the largest rectangle to encompass additional data from the design data that may be necessary for more complex DRC rule analysis; and generating a unit level test case based on the coordinates of the new rectangle.

Figure 8:
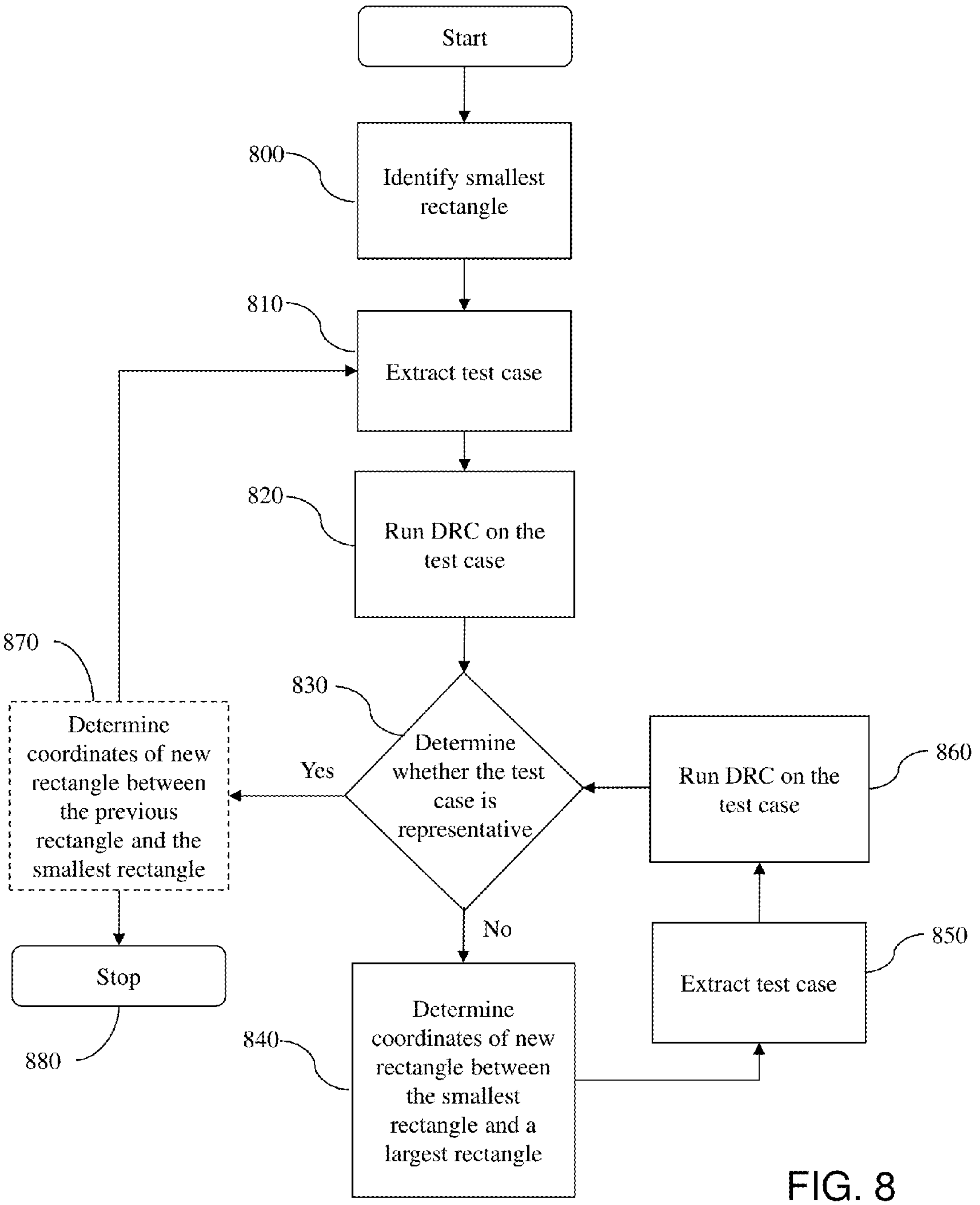
FIGS. 8 and 9 show flowcharts of processes in accordance with aspects of the invention.
Figure 9:
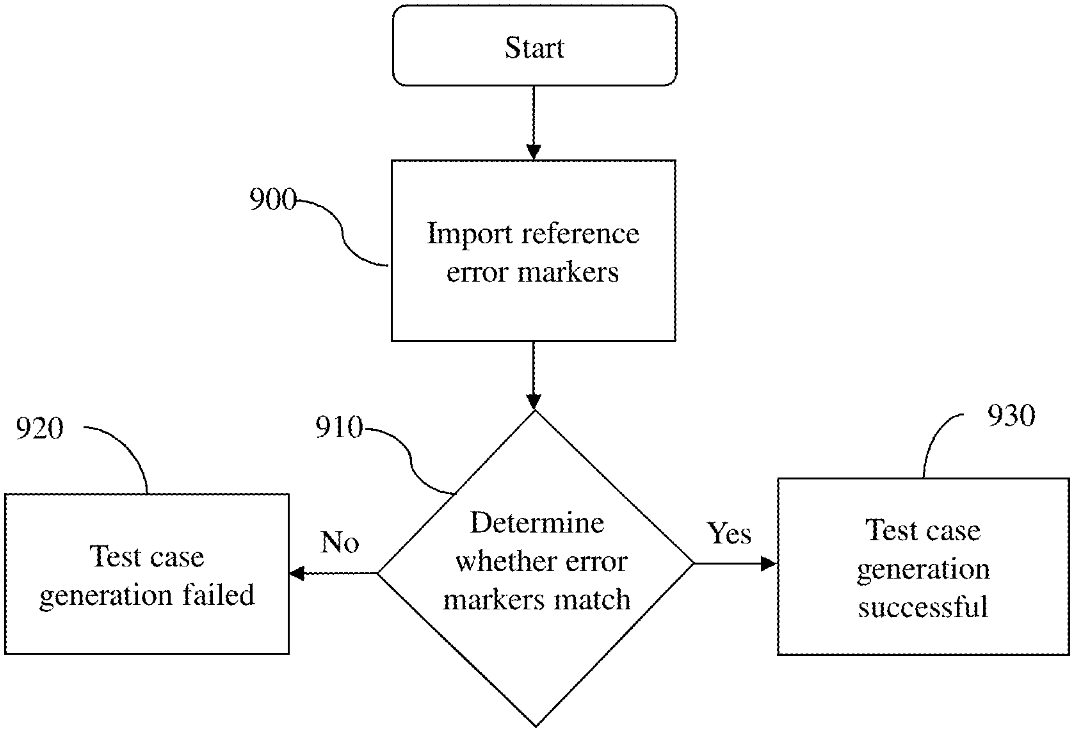

FIGS. 8 and 9 show exemplary flowcharts and/or block diagram s for performing aspects of the present invention. The steps of FIGS. 8 and 9 may be implemented, for example, in the environment of FIG. 6, which is described in greater detail herein. As noted above, the flowcharts illustrate the architecture, functionality, and operation of possible implementations of systems, methods, and computer program products according to various embodiments of the present invention. More specifically, FIGS. 8 and 9 depict exemplary flowcharts for processes in accordance with aspects of the present invention. The steps of FIGS. 8 and 9 may be performed by a computer-based design tool using commands that are included in (e.g., programmed in) the design tool. The computer-based design tool may be implemented in the environment of FIG. 6, for example, and may comprise a combination of hardware and special-purpose software that is configured to perform the functions described herein.

As shown in FIG. 8, at step 800, the design tool identifies a smallest rectangle (e.g., a simple test case boundary or first rectangle) encompassing an identified error (e.g., a reference error marker) in accordance with the processes described with respect to FIGS. 3A-C, 4, and 5. In embodiments, the design tool identifies a smallest rectangle that encloses a polygon created at step 440 of FIG. 4 or, when step 440 of FIG. 4 is omitted, the smallest rectangle that contains all of the polygons touching a temporary error polygon as identified at step 430 of FIG. 4.

At step 810, the design tool extracts data from the design data that is included within the smallest rectangle and saves the data in a test case data structure. More specifically, the test case data structure (e.g., a file) may be created by extracting and saving data of the design (e.g., original GDS data) that is included in the smallest rectangle. In embodiments, the extracted data from the design data includes the reference error marker of the identified error as a first GDS layer (e.g., REF_ERROR).

At step 820, the design tool may run DRC on the extracted test case data structure to determine whether the physical layout encompassed within the smallest rectangle satisfies the DRC rules. The DRC may be run similar to that described with respect to step 400 of FIG. 4 and utilize the DRC rules run in step 800 as described with respect to FIGS. 3A-C, 4, and 5 to identify any errors within the extracted test case data structure. In accordance with these aspects of the invention, the DRC rules in this instance may be more complex than most spacing based rules and require, for example, sizing of objects to touch the error marker, connectivity information, and/or sizing of compound derived layers. In embodiments, any error identified by the DRC run is identified by a reference error marker as a second GDS layer (e.g., CAL_ERROR). As should be understood, when the physical layout encompassed within the smallest rectangle is captured correctly in the extracted test case data structure, the error identified in step 800 should again be identified in this DRC run (e.g., the extracted test case data structure is representative of the identified error in step 800).

At step 830, the design tool determines whether the extracted test case data structure is representative of the identified error in step 800. In embodiments, the determination may include importing any reference error markers identified in step 820 as the second GDS layer, and determining whether the reference error marker identified in step 800 and extracted in step 810 as the first GDS layer (e.g., REF_ERROR) matches at least one reference error marker identified in step 820 and imported as the second GDS layer, as discussed in detail herein with respect to FIG. 9.

When the extracted test case data structure is not representative of the identified error in step 800 (i.e., the test case generation is identified as failed), the process proceeds to step 840. At step 840, the design tool determines coordinates of a new rectangle (e.g., a second rectangle) that is positioned (e.g., halfway) between the coordinates of the smallest rectangle (e.g., the first rectangle) and coordinates of a largest rectangle (e.g., a third rectangle). In embodiments, step 840 may further include the design tool determining coordinates of the largest rectangle in accordance with dimensions of the chip edge. However, it should be understood to those of ordinary skill in the art that the coordinates of the largest rectangle may be determined at any step described previously herein.

At step 850, the design tool extracts data from the design data that is included within the new rectangle and saves the data in a new test case data structure. More specifically, the new test case data structure (e.g., a file) may be created by extracting and saving data of the design (e.g., original GDS data) that is included in the new rectangle.

At step 860, the design tool may run DRC on the extracted new test case data structure to determine whether the physical layout encompassed within the new rectangle satisfies the DRC rules. The DRC may be run similar to that described with respect to step 400 of FIG. 4 and utilize the DRC rules run in step 800 as described with respect to FIGS. 3A-C, 4, and 5 to identify any errors within the extracted test case data structure. In embodiments, any error identified by the DRC run is identified by a reference error marker as an n (e.g., a third, fourth, fight. etc) GDS layer (e.g., CALN_ERROR). As should be understood, when the physical layout encompassed within the new rectangle is captured correctly in the extracted new test case data structure, the same error identified in step 800 should again be identified in this DRC run (e.g., the extracted new test case data structure is representative of the identified error in step 800).

Accordingly, the process after step 860 cycles back to step 830 to determine whether the extracted new test case data structure is representative of the identified error in step 800. A should be understood, the determination performed in step 830 includes importing any reference error markers identified in step 860 as the n GDS layer, and determining whether the reference error marker identified in step 800 and extracted in step 810 as the first GDS layer (e.g., REF_ERROR) matches at least one reference error marker identified in step 860 and imported as the n GDS layer, as discussed in detail herein with respect to FIG. 9. In the instance where the extracted new test case data structure is not representative of the identified error in step 800, the process continues again at step 840. However, in this instance, the design tool determines coordinates of a newer rectangle (e.g., a fourth rectangle) that is positioned (e.g., halfway) between the coordinates of the previously new rectangle and coordinates of the largest rectangle (e.g., the region encompassed by the newer rectangle is expanded in an attempt to include the design data needed for analysis of the identified error in step 800).

With reference back to step 830, when the extracted test case data structure is representative of the identified error in step 800 (i.e., the test case generation is identified as successful), the process proceeds to optional step 870. At optional step 870, the extracted test case data structure may be optimized to a smaller test case data structure. For example, if a designer decides that the rectangle used to extract the test case data structure could be smaller (e.g., less computationally expensive), then coordinates of a newer rectangle (e.g., a fourth rectangle) may be determined that is positioned (e.g., halfway) between the coordinates of the previous rectangle and coordinates of the smallest rectangle (e.g., the region encompassed by the newer rectangle is narrowed in an attempt to include less design data needed for analysis of the identified error in step 800). In embodiments, the coordinates of the new rectangle may be selected by the designer or generated by the design tool. In either event, the process proceeds back to step 810 to extract the test case data from the new rectangle, and thereafter run DRC of the newly extracted test case in accordance with aspects of the present invention.

At step 870, the process stops since the same error instance of interest has been extracted out in the test case data structure. To this end, the representative test case should: be much smaller than the whole existing design (e.g., the largest rectangle); reproduce the identified error seen in the first DRC run performed in step 800; and clearly show the structure that resides in the design. Showing the structure that resides in the design is useful since a design manual change may result from the discrepancy, in which case it is useful to be aware of the exact structure in the design to determine whether it is consistent with the intent of the design manual.

As shown in FIG. 9, at step 900 the design tool imports any reference error markers identified in step 820 as the second GDS layer or step 860 as the n GDS layer, as described with respect to FIG. 8. For example, DRC error markers identified in steps 820 or 860 of FIG. 8 may be imported as GDS layers CAL_ERROR or CALN_ERROR.

At step 910, the design tool determines whether the reference error marker identified in step 800 and extracted in step 810 of FIG. 8 as the first GDS layer matches at least one reference error marker identified in step 820 and imported as the second GDS layer or step 860 and imported as the n GDS layer. In embodiments, this determination may be performed by the design tool running a DRC compare command to ensure that at least one newly identified error marker (e.g., CAL_ERROR) exactly matches the original identified error marker (e.g., REF_ERROR).

When at least one newly identified error marker does not match the original identified error marker, the design tool determines that the extracted test case data structure is not representative of the identified error in step 800, and the process proceeds to step 920 where the test case generation is identified as failed. When at least one newly identified error marker matches the original identified error marker, the design tool determines that the extracted test case data structure is representative of the identified error in step 800, and the process proceeds to step 930 where the test case generation is identified as successful.

Figure 10:
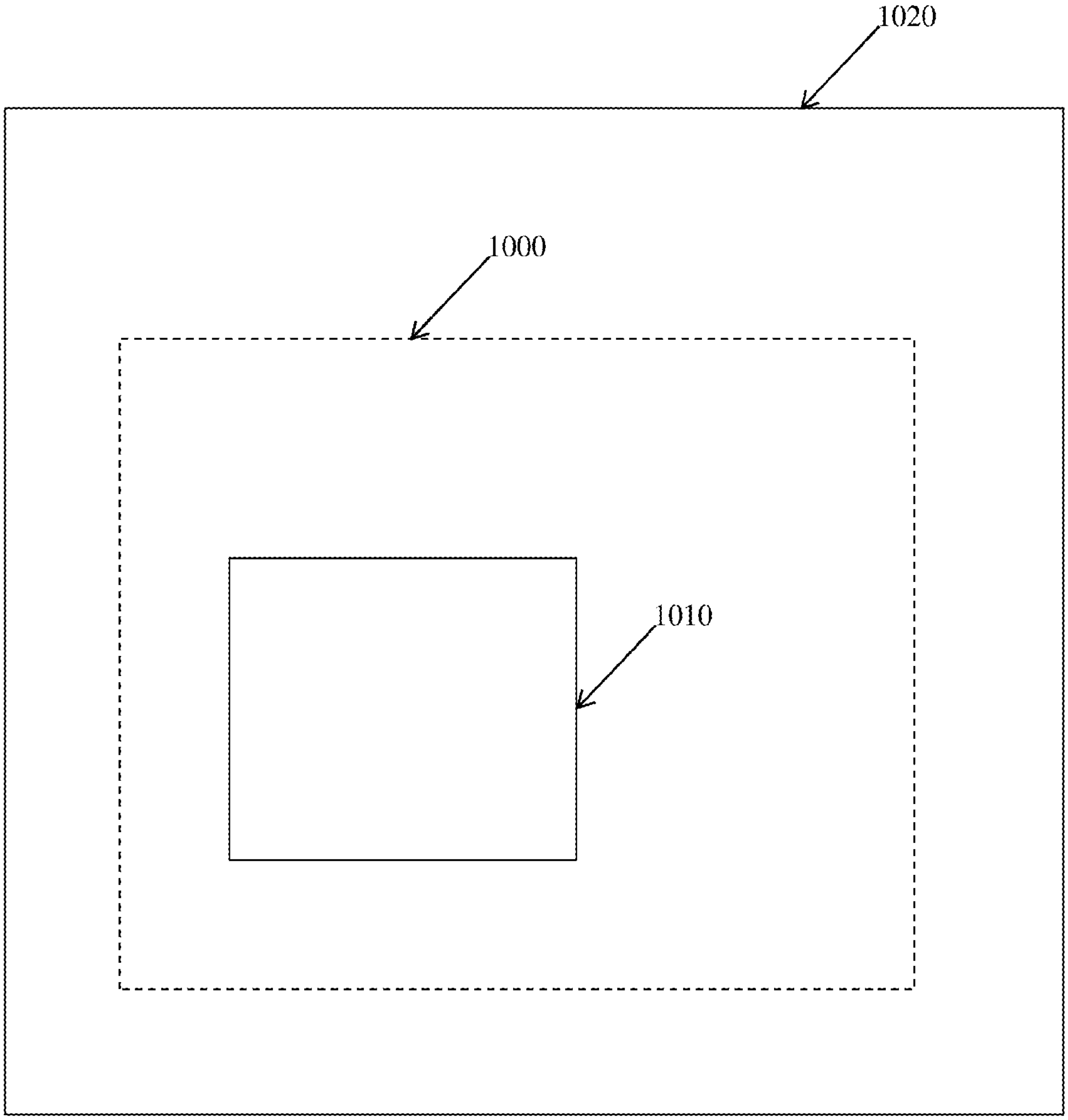
FIG. 10 depicts rectangles determined in accordance with aspects of the invention.

FIG. 10 illustrates the determination of coordinates of the new rectangle 1000 that is positioned between the coordinates of the smallest rectangle 1010 (e.g., simple test case boundary) and coordinates of a largest rectangle (e.g., the chip edge) 1020. In embodiments, the coordinates of the chip edge for generating the largest rectangle 1020 may be obtained from the design data for the integrated circuit.

As described herein, implementations of the invention may be used to save significant amounts of time by generating test cases at the time of IP testing. Moreover, aspects of the methods described herein are technology independent and can be implemented using commands of commercial DRC tools. Test cases according to aspects of the invention may also be automatically generated at regression testing time and used to improve the debugging during regression testing. Furthermore, application engineers may use aspects of the invention to report DRC discrepancies and to reduce the size of test cases included for debug purposes, e.g., from 36 Mb to 16 Kb in one example, and from 236 Mb to 246 Kb in another example.

As described herein, and according to aspects of the invention, when a discrepancy is seen between two DRC tools, the one flagging the error will display an error marker, e.g., a polygon, showing the region where the DRC rule is failing. Implementations of the invention identify a minimal region around the error marker which will reproduce the error even when the error is identified with complex DRC rules that include, for example, size commands, compound layers, and/or connectivity information. Implementations of the invention identify the smallest region around the error marker which reproduces the discrepancy by using the error marker as the reference. All shapes in the design involved in that error (e.g., that interact, touch, overlap, etc., the error marker) are used to generate a polygonal region which is involved in flagging this error. The coordinates of smallest rectangle enclosing this polygon are then extracted, which is in turn used to generate the unit level test case. The unit level test cases, owing to their small sizes, are relatively simpler than entire designs in analyzing and resolving the discrepancy. Additionally, these unit level test cases can be added to regression test libraries for future DRC deck validation.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of generating a test case in design rule checking to determine whether a physical layout of circuit components on an integrated circuit device satisfies predetermined design rules, comprising:

extracting coordinates of an error marker for a first error identified in an integrated circuit design corresponding to the integrated circuit device, the first error indicating that a shape, size or location of one of the circuit components on the integrated circuit device would violate one of the design rules;

identifying a first rectangle that encloses the error marker;

generating a first test case based on data of the integrated circuit design contained within the first rectangle;

determining whether the first test case is representative of the first error;

in response to determining the first test case is not representative of the first error, identifying a second rectangle that is larger than the first rectangle and between the first rectangle and a third rectangle which corresponds to an edge of a chip which comprises the integrated circuit device; and generating a second test case based on data of the integrated circuit design contained within the second rectangle.

2. The method of claim 1, further comprising:

creating an error polygon using the coordinates of the error marker;

selecting polygons in the integrated circuit design that touch the error polygon; and identifying the first rectangle that encloses the selected polygons, wherein the selecting the polygons comprises selecting the polygons in the integrated circuit design that touch the error polygon and which are included in a list of layers associated with a design rule.

3. The method of claim 1, further comprising running a design rule check on the first test case to identify a second error, wherein the determining whether the first test case is representative of the first error comprises:

importing a reference error marker for the second error; and comparing the reference error marker for the second error to the error marker for the first error.

4. The method of claim 3, wherein:

when the reference error marker for the second error matches the error marker for the first error, the first test case is determined as representative of the first error; and when the reference error marker for the second error does not match the error marker for the first error, the first test case is determined as not representative of the first error.

5. The method of claim 4, further comprising extracting data from the integrated circuit design that is included within the first rectangle and saving the data as the first test case, wherein the data includes the error marker for the first error as a first GDS layer.

6. The method of claim 5, further comprising extracting data from the integrated circuit design that is included within the second rectangle and saving the data as the second test case, wherein the data includes the reference error marker for the second error as a second GDS layer.

7. The method of claim 1, further comprising using the second test case to debug a runset.

8. The method of claim 1, wherein the identifying the second rectangle that is between the first rectangle and the third rectangle comprises identifying the second rectangle to be half way between the first rectangle and the third rectangle.

9. The method of claim 1, further comprising:

determining whether the second test case is representative of the first error;

in response to determining the second test case is not representative of the first error, identifying a fourth rectangle that is between the second rectangle and the third rectangle; and generating a third test case based on data of the integrated circuit design contained within the fourth rectangle.

10. The method of claim 1, further comprising in response to determining the first test case is representative of the first error, using the first test case to debug a runset.

11. The method of claim 1, further comprising in response to determining the first test case is representative of the first error, identifying a fourth rectangle that is between the first rectangle and the second rectangle; and generating a third test case based on data of the integrated circuit design contained within the fourth rectangle.

12. A system for generating a test case in design rule checking to determine whether a physical layout of circuit components on an integrated circuit device satisfies predetermined design rules, comprising:

a computer device comprising a processor and a design tool that is structured and configured to:

perform design rule checking of an integrated circuit design corresponding to the integrated circuit device;

identify a first violation of a design rule during the design rule checking;

extract coordinates of an error marker associated with the violation, the first violation indicating that a shape, size or location of one of the circuit components on the integrated circuit device would violate one of the design rules;

identify a first rectangle that encloses the error marker;

generate a first test case based on data of the integrated circuit design contained within the first rectangle;

determine whether the first test case is representative of the first violation;

in response to determining the first test case is not representative of the first violation, identify a second rectangle that is larger than the first rectangle and half way between the first rectangle and a third rectangle which corresponds to an edge of a chip which comprises the integrated circuit device; and generate a second test case based on data of the integrated circuit design contained within the second rectangle.

13. The system of claim 12, wherein the design tool is further structured and configured to:

create an error polygon using the coordinates of the error marker;

select polygons in the integrated circuit design that touch the error polygon; and identify the first rectangle that encloses the selected polygons, wherein the selecting the polygons comprises selecting the polygons in the integrated circuit design that touch the error polygon and which are included in a list of layers associated with a design rule.

14. The system of claim 12, wherein:

the design tool is further structured and configured to run a design rule check on the first test case to identify a second violation; and the determining whether the first test case is representative of the first violation comprises:

importing a reference error marker for the second violation; and comparing the reference error marker for the second violation to the error marker for the first violation.

15. The system of claim 14, wherein:

when the reference error marker for the second violation matches the error marker for the first violation, the first test case is determined as representative of the first violation; and when the reference error marker for the second violation does not match the error marker for the first violation, the first test case is determined as not representative of the first violation.

16. A computer program product for generating a test case in design rule checking to determine whether a physical layout of circuit components on an integrated circuit device satisfies predetermined design rules, the computer program product comprising a computer readable storage medium having program code embodied therewith, the program code being readable and/or executable by a processor of a computer device to perform a method comprising:

extracting coordinates of an error marker for a first error identified in an integrated circuit design corresponding to the integrated circuit device, the first error indicating that a shape, size or location of one of the circuit components on the integrated circuit device would violate one of the design rules;

identifying a first rectangle that encloses the error marker;

generating a first test case based on data of the integrated circuit design contained within the first rectangle;

running a design rule check on the first test case to identify a second error;

importing a reference error marker for the second error;

comparing the reference error marker for the second error to the error marker for the first error;

in response to the reference error marker for the second error not matching the error marker for the first error, identifying a second rectangle that is larger than the first rectangle and between the first rectangle and a third rectangle which corresponds to an edge of a chip which comprises the integrated circuit device; and generating a second test case based on data of the integrated circuit design contained within the second rectangle.

17. The computer program product of claim 16, further comprising in response to the reference error marker for the second error matching the error marker for the first error, using the first test case to debug a runset.

18. The computer program product of claim 16, further comprising:

in response to the reference error marker for the second error matching the error marker for the first error, identifying a fourth rectangle that is between the first rectangle and the second rectangle; and generating a third test case based on data of the integrated circuit design contained within the fourth rectangle.

19. The computer program product of claim 16, wherein the first rectangle is a smallest rectangle that encloses polygons in the integrated circuit design that are associated with a design rule and that touch an error polygon that comprises the error marker.

* * * * *